US 010541388B2

(12) United States Patent
Yug

(10) Patent No.: US 10,541,388 B2
(45) Date of Patent: Jan. 21, 2020

(54) METHOD FOR FABRICATING A DISPLAY DEVICE ARE CAPABLE OF SUBSTANTIALLY MINIMIZING DAMAGE AND CARBONIZATION OF A SUBSTRATE

(71) Applicant: Samsung Display Co., Ltd., Yongin-si, Gyeonggi-do (KR)

(72) Inventor: Geunwoo Yug, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/404,512

(22) Filed: May 6, 2019

(65) Prior Publication Data

US 2019/0259978 A1 Aug. 22, 2019

Related U.S. Application Data

(62) Division of application No. 15/820,192, filed on Nov. 21, 2017, now Pat. No. 10,326,113.

(30) Foreign Application Priority Data

Dec. 2, 2016 (KR) .......................... 10-2016-0163674

(51) Int. Cl.
*H01L 21/027* (2006.01)
*H01L 51/56* (2006.01)
(Continued)

(52) U.S. Cl.
CPC .......... *H01L 51/56* (2013.01); *B23K 26/0624* (2015.10); *B23K 26/38* (2013.01);
(Continued)

(58) Field of Classification Search
CPC ................. H01L 21/0274; H01L 51/50; H01L 2224/0363; H01L 2224/1163;
(Continued)

(56) References Cited

U.S. PATENT DOCUMENTS

| 6,236,446 B1 | 5/2001 | Izumi et al. |
| 2015/0264805 A1 | 9/2015 | Chen et al. |

(Continued)

FOREIGN PATENT DOCUMENTS

| EP | 2328169 A1 | 6/2011 |
| KR | 10-0495051 B1 | 6/2005 |

(Continued)

OTHER PUBLICATIONS

EPO Extended Search Report dated Feb. 13, 2018, corresponding to European Patent Application No. 17204580.9 (5 pages).

*Primary Examiner* — Hoai V Pham

(74) *Attorney, Agent, or Firm* — Lewis Roca Rothgerber Christie LLP

(57) ABSTRACT

A display device and a method of manufacturing the display device are capable of substantially minimizing damage and carbonization of a substrate, the display device including: a substrate including a first area and a second area disposed in a first direction and including at least one layer disposed along a second direction intersecting the first direction; a display layer in the first area of the substrate; a functional member on the display layer in the first area of the substrate; and a driving unit in the second area of the substrate, the driving unit configured to drive the display layer. Said at least one layer includes a first end portion at the first area of the substrate and a second end portion at the second area of the substrate, and the first end portion has a greater surface roughness than a surface roughness of the second end portion.

4 Claims, 17 Drawing Sheets

(51) Int. Cl.
  *H01L 51/00* (2006.01)
  *H01L 27/32* (2006.01)
  *B23K 26/402* (2014.01)
  *B23K 26/0622* (2014.01)
  *H01L 51/52* (2006.01)
  *G02F 1/1333* (2006.01)
  *B23K 26/38* (2014.01)
  *G02F 1/1335* (2006.01)

(52) U.S. Cl.
  CPC ...... *B23K 26/402* (2013.01); *G02F 1/133351* (2013.01); *H01L 27/323* (2013.01); *H01L 27/3276* (2013.01); *H01L 51/0096* (2013.01); *H01L 51/5246* (2013.01); *G02F 1/133528* (2013.01); *H01L 51/5253* (2013.01); *H01L 51/5281* (2013.01); *H01L 2227/323* (2013.01); *H01L 2251/566* (2013.01)

(58) Field of Classification Search
  CPC ... H01L 2224/11632; H01L 2224/2763; H01L 2224/27632
  See application file for complete search history.

(56) References Cited

U.S. PATENT DOCUMENTS

2016/0126422 A1* 5/2016 Jeon ................. H01L 33/20
                                                         257/98
2017/0279071 A1   9/2017 Tamekawa et al.

FOREIGN PATENT DOCUMENTS

| KR | 10-0514075 B1 | 11/2005 |
| KR | 10-0747681 B1 | 8/2007 |
| KR | 10-2016-0092475 A | 8/2016 |

* cited by examiner

METHOD FOR FABRICATING A DISPLAY DEVICE ARE CAPABLE OF SUBSTANTIALLY MINIMIZING DAMAGE AND CARBONIZATION OF A SUBSTRATE

CROSS-REFERENCE TO RELATED APPLICATION

This application is a divisional of U.S. patent application Ser. No. 15/820,192, filed Nov. 21, 2017, which claims priority to and the benefit of Korean Patent Application No. 10-2016-0163674, filed on Dec. 2, 2016 in the Korean Intellectual Property Office (KIPO), the disclosure of which is incorporated by reference herein in its entirety.

1. Field

Aspects of exemplary embodiments of the present invention relate to a display device and to a method of manufacturing the display device.

2. Discussion of Related Art

A display device includes a plurality of pixels provided in an area defined by a black matrix or a pixel defining layer. Examples of the display device may include a liquid crystal display ("LCD") device, a light emitting element display device, such as an organic light emitting diode ("OLED") display device, and an electrophoretic display device.

The above information disclosed in this Background section is only for enhancement of understanding of the background of the inventive concept, and therefore, it may contain information that does not form prior art.

SUMMARY

Exemplary embodiments of the present invention are directed to a display device having reduced or minimized carbonization of a substrate and to a method of manufacturing the same.

According to an exemplary embodiment, a display device includes: a substrate having a first area and a second area adjacent each other in a first direction, the substrate including a plurality of layers stacked in a second direction crossing the first direction, a first one of the layers having a first end portion at the first area of the substrate and a second end portion at the second area of the substrate, the first end portion having a greater surface roughness than the second end portion; a display layer in the first area of the substrate; a functional member on the display layer in the first area of the substrate; and a driver in the second area of the substrate, the driver being configured to drive the display layer.

A length of the second end portion in the second direction may be longer than the first end portion in the second direction.

The first one of the layers may have first and second surfaces facing each other, and the first surface may be nearer to the functional member from among the first and second surfaces. An angle between the first end portion and the first surface of the first one of the layers may be greater than an angle between the second end portion and the first surface of the first one of the layers.

The first one of the layers may be a base layer, and a second one of the layers may be a protective layer stacked on the base layer in the second direction. The base layer may be nearer to the display layer from among the base layer and the protective layer.

The substrate may further include an adhesive layer between the base layer and the protective layer.

The protective layer may have a groove at the second area of the substrate.

The groove may be in a surface of the protective layer farthest from the base layer from among surfaces of the protective layer.

The functional member may include at least one of a polarizer and a touch screen panel.

The display device may further include a protective layer on the functional member in the second direction, and the functional member may be between the protective layer and the substrate at the first area of the substrate.

The display device may further include an adhesive layer between the substrate and the functional member at the first area of the substrate.

According to another embodiment of the present invention, a method of manufacturing a display device includes: forming a display layer at a first area of a substrate, the substrate having the first area and a second area adjacent the first area in a first direction, the substrate including a plurality of layers stacked in a second direction crossing the first direction; providing a functional member to the substrate at the first area to overlap the display layer; and cutting the substrate and the functional member by irradiating a laser beam along a cutting line extending around a periphery of the first area and the second area. The laser beam applied to a portion of the cutting line corresponding to a periphery of the first area has a higher intensity than an intensity of a laser beam applied to a portion of the cutting line corresponding to a periphery of the second area.

The laser beam applied to the portion of the cutting line corresponding to the periphery of the first area may be irradiated to the substrate at a power of about 15 W to about 25 W, and the laser beam applied to the portion of the cutting line corresponding to the periphery of the second area may be irradiated to the substrate at a power of about 3 W to about 10 W.

The laser beam may be irradiated to the substrate in a pulse manner having a frequency of about 400 Hz.

The laser beam may have a spot size of about 22 µm.

The foregoing is illustrative only and is not intended to be in any way limiting. In addition to the illustrative aspects, exemplary embodiments, and features described above, further aspects, exemplary embodiments, and features will become apmother by reference to the drawings and the following detailed description.

BRIEF DESCRIPTION OF THE DRAWINGS

A more complete appreciation of the present invention will become more apparent by describing, in detail, exemplary embodiments thereof with reference to the accompanying drawings, wherein.

DETAILED DESCRIPTION

Figure 1:
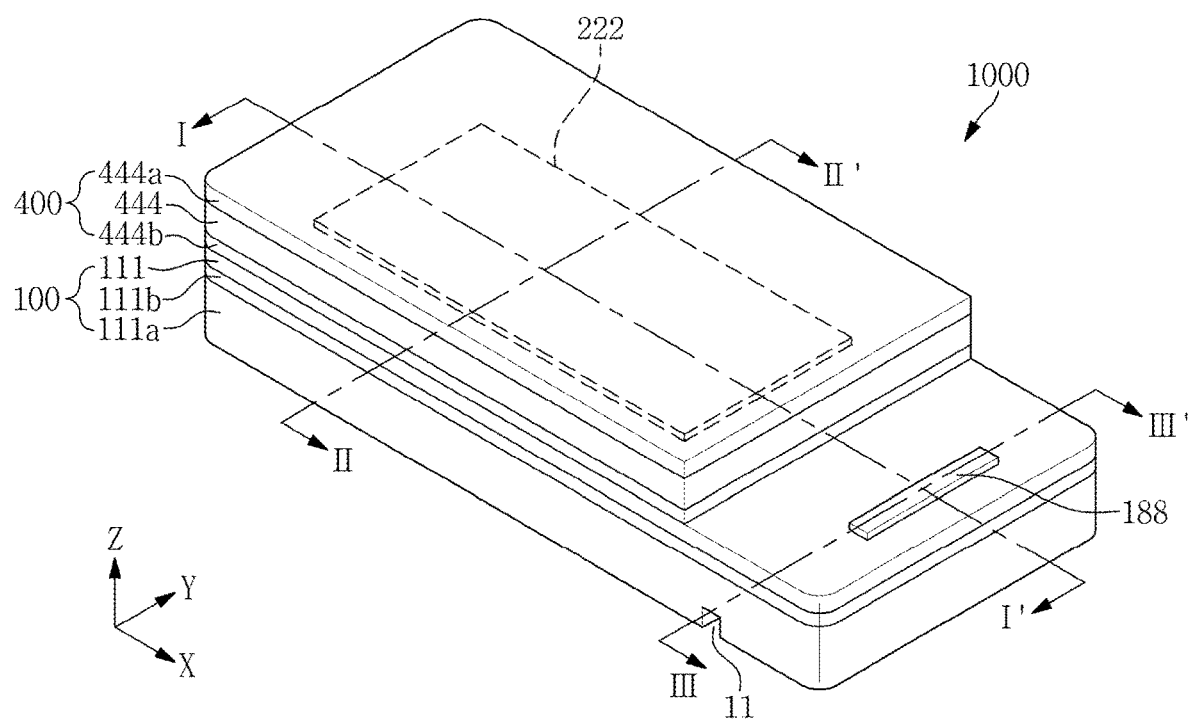
FIG. 1 is a perspective view illustrating a display device according to an exemplary embodiment.

Exemplary embodiments of the present invention will now be described more fully hereinafter with reference to the accompanying drawings. Although the present invention may be modified in various manners and includes several exemplary embodiments, certain exemplary embodiments are illustrated in the accompanying drawings and will be primarily described in the specification. However, the scope of the present invention is not limited to the exemplary embodiments and should be construed as including all changes, equivalents, and substitutions included in the spirit and scope of the present invention.

In the drawings, thicknesses of layers and areas may be illustrated in an enlarged manner for clarity and ease of description thereof. When a layer, area, or plate is referred to as being "on" another layer, area, or plate, it may be directly on the other layer, area, or plate or intervening layers, areas, or plates may be present therebetween. When a layer, area, or plate is referred to as being "directly on" another layer, area, or plate, no intervening layers, areas, or plates are present therebetween. Further, when a layer, area, or plate is referred to as being "below" another layer, area, or plate, it may be directly below the other layer, area, or plate or intervening layers, areas, or plates may be present therebetween. When a layer, area, or plate is referred to as being "directly below" another layer, area, or plate, no intervening layers, areas, or plates are present therebetween.

The spatially relative terms "below", "beneath", "less", "above", "upper", and the like may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus, the spatially relative terms may be interpreted differently depending on the orientations.

Throughout the specification, when an element is referred to as being "connected to" another element, the element may be "directly connected to" the other element, indirectly connected to the other element by an intervening element, or "electrically connected to" the other element with an intervening element interposed therebetween. It will be further understood that the terms "comprises," "comprising," "includes," and/or "including," when used in this specification, specify the presence of the stated features, integers, steps, operations, elements, and/or components but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

As used herein, the singular forms "a" and "an" are intended to include the plural forms as well, unless the context clearly indicates otherwise. Further, the use of "may" when describing embodiments of the present invention relates to "one or more embodiments of the present invention."

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the aspects or parts of the below-described exemplary embodiments that are not necessary for one of ordinary skill in the art to understand the description may not be described in order to more specifically describe aspects of exemplary embodiments of the present invention, and like reference numerals refer to like elements throughout the specification.

Hereinafter, a display device and a method of manufacturing the display device will be described with reference to FIGS. 1-20.

Figure 2:
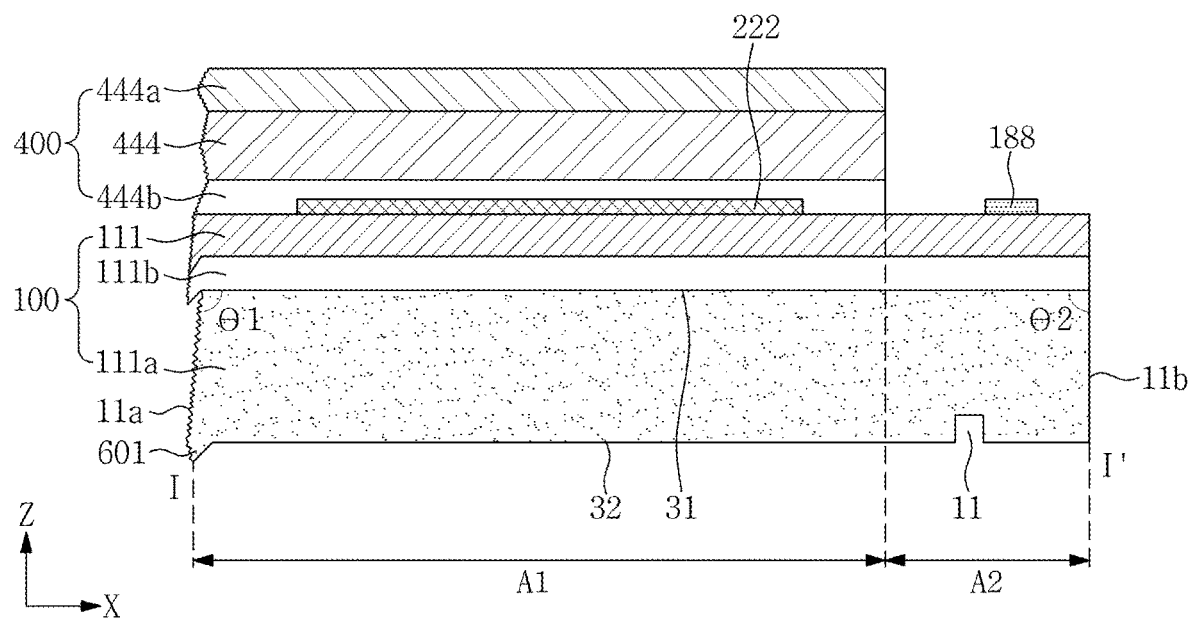
FIG. 2 is a cross-sectional view taken along the line I-I' of FIG. 1.
Figure 3:
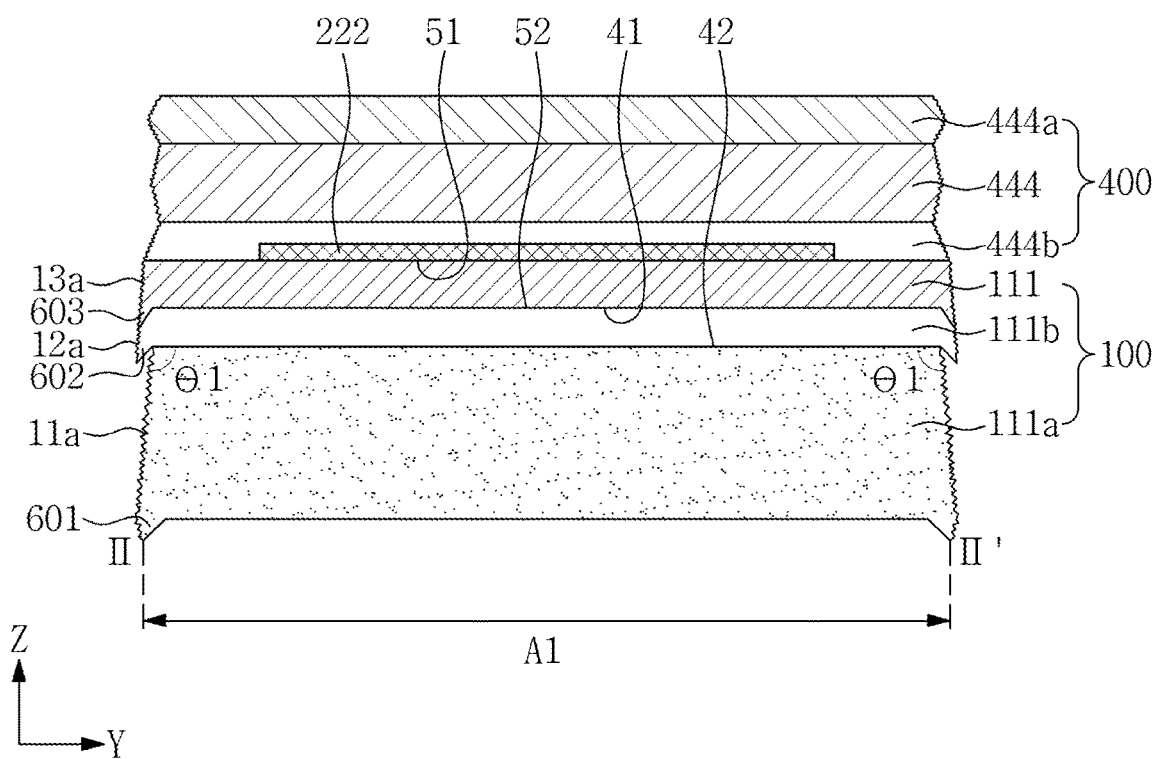
FIG. 3 is a cross-sectional view taken along the line II-II' of FIG. 1.
Figure 4:
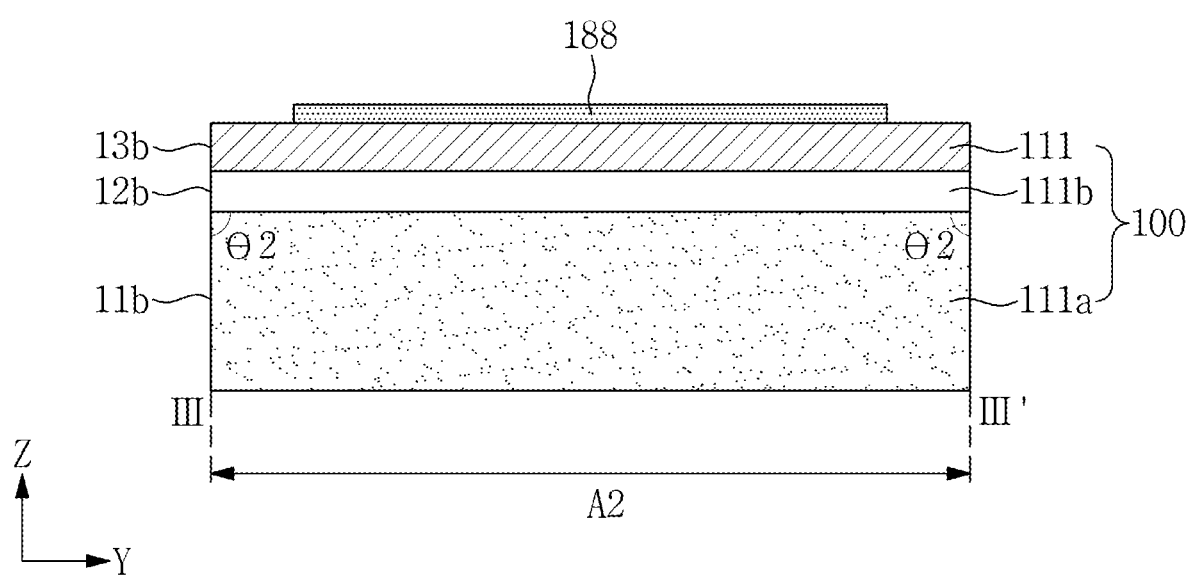
FIG. 4 is a cross-sectional view taken along the line III-III' of FIG. 1.

FIG. 1 is a perspective view illustrating a display device according to an exemplary embodiment, FIG. 2 is a cross-sectional view taken along the line I-I' of FIG. 1, FIG. 3 is a cross-sectional view taken along the line II-II' of FIG. 1, and FIG. 4 is a cross-sectional view taken along the line III-III' of FIG. 1.

As illustrated in FIG. 1, the display device 1000 according to an exemplary embodiment may include a substrate 100, a display layer 222, a polarizer 400, and a driving unit (e.g., a driver) 188.

As illustrated in FIG. 2, the substrate 100 includes a first area A1 and a second area A2 arranged in (e.g., adjacent each other in) a direction parallel to an X axis (hereinafter, "an X-axis direction"). That is, the first and second areas A1 and A2 are arranged on an X-Y plane of the substrate 100.

As illustrated in FIGS. 1-3, the display layer 222 and the polarizer 400 are disposed in the first area A1 of the substrate 100. The first area A1 is a non-pad area, and the non-pad area may include a display area and a non-display area.

As illustrated in FIGS. 1-3, the display layer 222 is located between the substrate 100 and the polarizer 400. The display layer 222 includes a plurality of pixels, and each pixel includes a light emitting element and a pixel circuit for driving the light emitting element.

As illustrated in FIGS. 1, 2, and 4, the driving unit 188 is disposed at the second area A2 of the substrate 100. The second area A2 is a pad area. The driving unit 188 is configured to drive the pixels of the display layer 222. The driving unit 188 includes a driving integrated circuit.

The substrate 100 may include at least one layer disposed along (e.g., on or stacked on the substrate 100 in) a direction parallel to a Z axis (hereinafter, "a Z-axis direction"). For example, as illustrated in FIG. 1, the substrate 100 may include a protective layer 111a (hereinafter, "a first protective layer"), an adhesive layer 111b (hereinafter, "a first adhesive layer"), and a base layer 111 that are stacked in the Z-axis direction. The Z axis crosses the X axis and a Y axis. For example, the Z axis perpendicularly crosses (or intersects) the X axis and the Y axis.

The first protective layer 111a of the substrate 100 is located at a lower portion of the base layer 111 in the Z-axis direction. As illustrated in FIGS. 1 and 2, the first protective layer 111a may have a groove 11. For example, the first protective layer 111a has an upper surface 31 adjacent to (e.g., contacting) the first adhesive layer 111b and a lower surface 32 facing the upper surface 31, and the groove 11 is located in the lower surface 32 of the first protective layer 111a. The groove 11 is located in the second area A2 of the substrate 100. The groove 11 may or may not overlap the driving unit 188 (e.g., may or may not overlap the driving unit 188 in the Z-axis direction).

The first protective layer 111a may include polyethylene terephthalate (PET) or a material including PET.

The first adhesive layer 111b is located between the first protective layer 111a and the base layer 111. The first adhesive layer 111b attaches (e.g., adheres) the base layer 111 and the first protective layer 111a to each other.

The first adhesive layer 111b may include an acryl or a material including an acryl.

The base layer 111 is located on (e.g., directly contacts) the first adhesive layer 111b. The base layer 111 includes an upper surface 51 and a lower surface 52 facing each other in the Z-axis direction. The upper surface 51 of the base layer 111 is adjacent to the display layer 222, and the lower surface 52 of the base layer 111 is adjacent to the first adhesive layer 111b.

The base layer 111 may be a transparent insulating layer including glass or transparent plastic. For example, the base layer 111 may include polyethersulfone (PES), polycarbonate (PC), polyimide (PI), such as Kapton (a registered trademark of E. I. De Pont De Nemours and Company of Wilmington, Del.), polyethylene terephthalate (PET), polyethylene naphthalate (PEN), polyacrylate (PAR), fiber reinforced plastic (FRP), and/or the like.

A layer included in the substrate 100 includes a first end portion located at the first area A1 of the substrate 100 and a second end portion located at the second area A2 of the substrate 100. For example, the first protective layer 111a includes a first end portion 11a located at the first area A1 and a second end portion 11b located at the second area A2.

The first end portion of at least one layer included in the substrate 100 may have a surface roughness greater than that of the second end portion. For example, the first end portion may have a rougher surface than that of the second end portion. For example, as illustrated in FIGS. 2 and 3, the first end portion 11a of the first protective layer 111a may have a greater roughness than that of the second end portion 11b.

In addition, a layer included in the substrate 100 includes facing surfaces, and one of the surfaces (hereinafter, "a lower surface") is positioned farther away from the polarizer 400 than another of the surfaces (hereinafter, "an upper surface") is therefrom. In such an exemplary embodiment, a protrusion is located at a portion where the lower surface of the at least one layer meets the first end portion of the at least one layer. For example, as illustrated in FIGS. 2 and 3, the first protective layer 111a includes the lower surface 32 and the upper surface 31 facing each other, and a protrusion 601 is located at a portion (hereinafter, "an edge portion") where the lower surface 32 of the first protective layer 111a meets the first end portion 11a. The protrusion 601 protrudes from the edge portion in the Z-axis direction. In such an exemplary embodiment, the protrusion 601 may further protrude from the edge portion in the X-axis direction and/or the Y-axis direction. As illustrated in FIGS. 2 and 4, no protrusion is located at the second end portion 11b of the first protective layer 111a.

Because the first end portion 11a has the protrusion 601, the first end portion 11a and the second end portion 11b have different lengths. The length of the first end portion 11a is a length in the Z-axis direction. Likewise, the length of the second end portion 11b is a length in the Z-axis direction. The first end portion 11a may be longer (e.g., may have a longer length) than the second end portion 11b. For example, as illustrated in FIG. 2, the first protective layer 111a includes the first end portion 11a at the first area A1 and the second end portion 11b at the second area A2. In such an exemplary embodiment, the first end portion 11a of the first protective layer 111a is longer (e.g., has a longer length) than the second end portion 11b of the first protective layer 111a. For example, the length of the first end portion 11a is longer than the second end portion 11b.

Further, as described above, a layer included in the substrate 100 includes a lower surface and an upper surface, and an angle between the upper surface and the first end portion is different from an angle between the upper surface and the second end portion. For example, the angle between the upper surface and the first end portion is greater than the angle between the upper surface and the second end portion. As another example, as illustrated in FIG. 2, an angle θ1 (hereinafter, "a first angle") between the upper surface 31 of the first protective layer 111a and the first end portion 11a is greater than an angle θ2 (hereinafter, "a second angle") between the upper surface 31 of the first protective layer 111a and the second end portion 11b. When the second angle θ2 is 90 degrees, the first angle θ1 may be an obtuse angle (e.g., an angle greater than 90 degrees).

In such an exemplary embodiment, a portion of the upper surface 31 located in the first area A1 may be a reference surface of the first angle θ1, and a portion of the upper surface 31 located in the second area A2 may be a reference surface of the second angle θ2. For example, the first angle θ1 may be an angle between the first end portion 11a and a portion of the upper surface 31 in the first area A1, and the second angle θ2 may be an angle between the second end portion 11b and a portion of the upper surface 31 in the second area A2.

In an exemplary embodiment, other components included in the substrate 100 may have substantially a same configuration as that of the first protective layer 111a described above.

For example, as illustrated in FIGS. 2-4, the base layer 111 included in the substrate 100 includes a first end portion 13a located at the first area A1 and a second end portion 13b located at the second area A2, and the first end portion 13a of the base layer 111 may have a greater surface roughness than that of the second end portion 13b of the base layer 111.

In addition, a protrusion 603 is located at an edge portion where the first end portion 13a of the base layer 111 meets the lower surface 52 of the base layer 111, and accordingly, the first end portion 13a of the base layer 111 is longer than (e.g., has a longer length than) the second end portion 13b of the base layer 111.

In addition, as described above, the base layer 111 included in the substrate 100 includes the lower surface 52 and the upper surface 51, and an angle between the upper surface 51 of the base layer 111 and the first end portion 13a of the base layer 111 may be greater than an angle between the upper surface 51 of the base layer 111 and the second end portion 13b of the base layer 111.

In addition, as illustrated in FIGS. 2-4, the first adhesive layer 111b included in the substrate 100 includes a first end portion 12a located at the first area A1 and a second end portion 12b located at the second area A2, and the first end portion 12a of the first adhesive layer 111b may have a greater surface roughness than that of the second end portion 12b.

A protrusion 602 is located at an edge portion where the first end portion 12a of the first adhesive layer 111b meets a lower surface 42 of the first adhesive layer 111b, and accordingly, the first end portion 12a of the first adhesive layer 111b is longer than (e.g., has a longer length than) the second end portion 12b of the first adhesive layer 111b.

In addition, as described above, the first adhesive layer 111b included in the substrate 100 includes the lower surface 42 and an upper surface 41 facing the lower surface, and an angle between the upper surface 41 of the first adhesive layer 111b and the first end portion 12a of first adhesive layer 111b may be greater than an angle between the upper surface 41 of the first adhesive layer 111b and the second end portion 12b of the first adhesive layer 111b.

As illustrated in FIGS. 1 and 2, a functional member, such as the polarizer 400, is located at the first area A1 of the substrate 100. The polarizer 400 is located on the substrate 100 in the Z-axis direction. The polarizer 400 may include an adhesive layer 444b (hereinafter, "a second adhesive layer"), a polarizing layer 444, and a protective layer 444a (hereinafter, "a second protective layer") that are stacked along the Z-axis direction.

The second adhesive layer 444b is located between the first area A1 of the substrate 100 and the polarizing layer 444. For example, the second adhesive layer 444b is located between the first area A1 of the base layer 111 and the polarizing layer 444.

The polarizing layer 444 is located between the second adhesive layer 444b and the second protective layer 444a.

Figure 5:
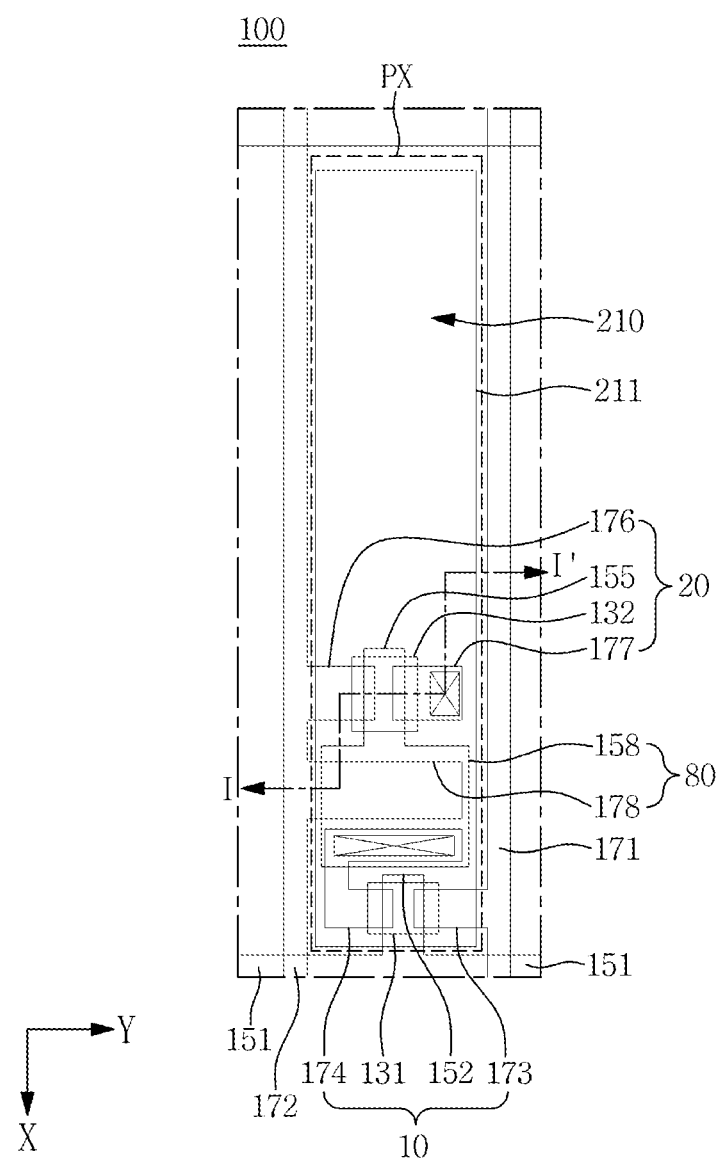
FIG. 5 is a plan view illustrating one pixel included in a display layer of the display device shown in FIG. 1.
Figure 6:
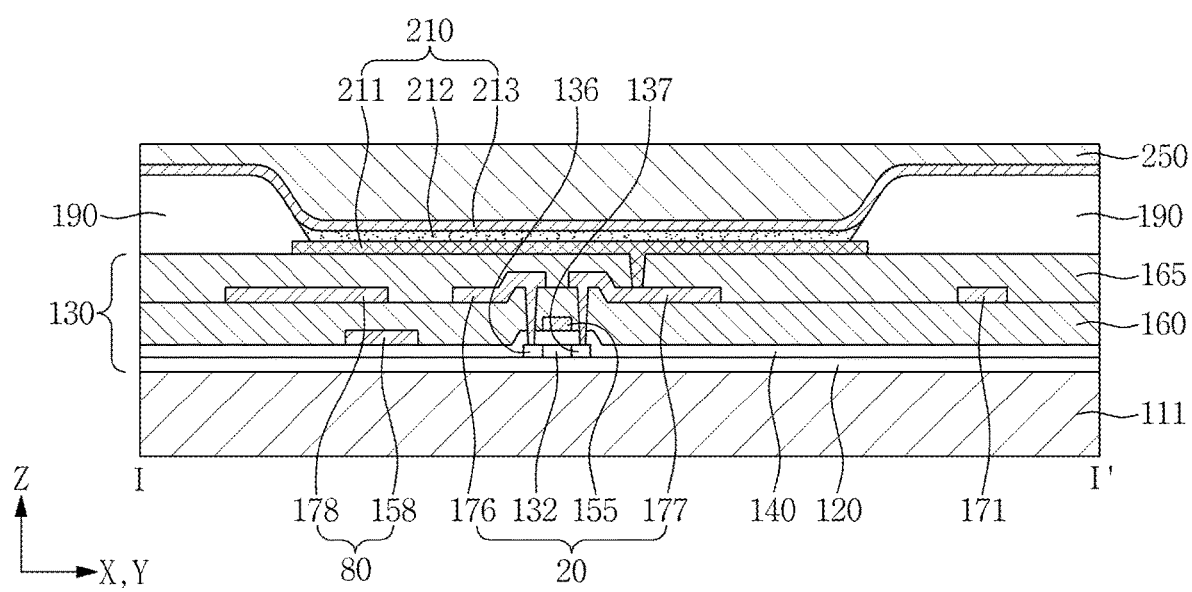
FIG. 6 is a cross-sectional view taken along the line I-I' of FIG. 5.

FIG. 5 is a plan view illustrating one pixel included in a display layer of the display device shown in FIG. 1, and FIG. 6 is a cross-sectional view taken along the line I-I' of FIG. 5.

As illustrated in FIGS. 5 and 6, a pixel PX includes a light emitting element 210 and a pixel circuit unit 130.

The pixel circuit unit 130 includes a switching thin film transistor ("TFT") 10, a driving TFT 20, and a capacitor 80.

The pixel PX may be located in an area (e.g., a pixel area) defined by a gate line 151, a data line 171, and a common power line 172.

The pixel PX includes the light emitting element 210 and the pixel circuit unit 130 for driving the light emitting element 210.

The light emitting element 210 may include a pixel electrode 211, a light emitting layer 212, and a common electrode 213. In such an exemplary embodiment, the light emitting element 210 may be an organic light emitting element.

The pixel circuit unit 130 is located on the base layer 111 of the substrate 100. For example, the switching TFT 10, the driving TFT 20, and the capacitor 80 are located on the base layer 111. The pixel circuit unit 130 is configured to drive the light emitting layer 212 of the light emitting element 210.

The detailed structures of the pixel circuit unit 130 and the light emitting element 210 are illustrated in FIGS. 5 and 6, but exemplary embodiments are not limited to the structures illustrated in FIGS. 5 and 6. The pixel circuit unit 130 and the light emitting element 210 may be formed to have various suitable structures within a range that may easily be modified by those skilled in the art.

Referring to FIG. 5, one pixel PX is depicted as including two TFTs and one capacitor, but exemplary embodiments are not limited thereto. In an exemplary embodiment, one pixel PX may include three or more TFTs and two or more capacitors and may have various suitable structures further including separate signal lines.

As used herein, the term "pixel" refers to a smallest unit for displaying an image and may be a red pixel that emits red light, a green pixel that emits green light, or a blue pixel that emits blue light.

The base layer 111 may be a transparent insulating layer including glass or transparent plastic. For example, the base layer 111 may include polyethersulfone (PES), polycarbonate (PC), polyimide (PI), such as Kapton (a registered trademark of E. I. De Pont De Nemours and Company of Wilmington, Del.), polyethylene terephthalate (PET), polyethylene naphthalate (PEN), polyacrylate (PAR), fiber reinforced plastic (FRP), and/or the like.

A buffer layer 120 may be disposed on the base layer 111. The buffer layer 120 reduces or substantially prevents permeation of undesirable elements therethrough, planarizes a surface therebelow, and may include suitable materials for reducing or preventing permeation and/or planarizing. For example, the buffer layer 120 may include a silicon nitride ($SiN_x$) layer, a silicon oxide ($SiO_2$) layer, and/or a silicon oxynitride ($SiO_xN_y$) layer. However, in other embodiments, the buffer layer 120 may be omitted based on the kinds of the base layer 111 and process conditions thereof.

A switching semiconductor layer 131 and a driving semiconductor layer 132 are disposed on the buffer layer 120. The switching semiconductor layer 131 and the driving semiconductor layer 132 may include a polycrystalline silicon layer, an amorphous silicon layer, and/or an oxide semiconductor including, for example, indium gallium zinc oxide (IGZO) and/or indium zinc tin oxide (IZTO). For example, when the driving semiconductor layer 132 illustrated in FIG. 6 includes a polycrystalline silicon layer, the driving semiconductor layer 132 includes a channel area that is not doped with impurities and p+ doped source and drain areas that are formed on opposite sides of the channel area. In such an exemplary embodiment, p-type impurities, such as boron (B), may be used as dopant ions, and $B_2H_6$ is typically used as the boron (B) dopant ions. Such impurities may vary depending on the kinds of TFTs.

The driving TFT 20 according to an exemplary embodiment uses a p-channel metal oxide semiconductor (PMOS) TFT including p-type impurities, but exemplary embodiments are not limited thereto. In other embodiments, the driving TFT 20 may use an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include tetraethyl orthosilicate (TEOS), silicon nitride ($SiN_x$), and/or silicon oxide ($SiO_2$). For example, the gate insulating layer 140 may have a double-layer structure including a $SiN_x$ layer having a thickness of about 40 nm and a TEOS layer having a thickness of about 80 nm that are sequentially stacked.

A gate wiring including gate electrodes 152 and 155 is disposed on the gate insulating layer 140. The gate wiring further includes the gate line 151, a first capacitor plate 158, and other wirings. In addition, the gate electrodes 152 and 155 are disposed to overlap at least a portion of or the entirety of the semiconductor layers 131 and 132, for example, a channel area thereof. The gate electrodes 152 and 155 substantially prevent the channel area from being doped with impurities when a source area 136 and a drain area 137 of the semiconductor layers 131 and 132 are doped with impurities during the process of forming the semiconductor layers 131 and 132.

The gate electrodes 152 and 155 and the first capacitor plate 158 are disposed on substantially a same layer and include substantially a same metal material. The gate electrodes 152 and 155 and the first capacitor plate 158 may include molybdenum (Mo), chromium (Cr), and/or tungsten (W).

An insulating interlayer 160 overlapping the gate electrodes 152 and 155 is disposed on the gate insulating layer 140. The insulating interlayer 160, similar to the gate insulating layer 140, may include or be formed of silicon nitride (SiNx), silicon oxide (SiOx), tetraethyl orthosilicate (TEOS), or the like, but exemplary embodiments are not limited thereto.

A data wiring including source electrodes 173 and 176 and drain electrodes 174 and 177 is disposed on the insulating interlayer 160. The data wiring further includes the data line 171, the common power line 172, a second capacitor plate 178, and other wirings. In addition, the source electrodes 173 and 176 and the drain electrodes 174 and 177 are connected to the source area 136 and the drain area 137 of the semiconductor layers 131 and 132, respectively, through contact openings (e.g., contact holes) defined in the gate insulating layer 140 and the insulating interlayer 160.

As such, the switching TFT 10 includes the switching semiconductor layer 131, the switching gate electrode 152, the switching source electrode 173, and the switching drain electrode 174. The driving TFT 20 includes the driving semiconductor layer 132, the driving gate electrode 155, the driving source electrode 176, and the driving drain electrode 177. Configurations of the TFTs 10 and 20 are not limited to the above embodiments and may be modified to have various suitable structures that may be easily conceived by those skilled in the art.

The capacitor 80 includes the first capacitor plate 158 and the second capacitor plate 178 with the insulating interlayer 160 interposed therebetween.

The switching TFT 10 may function as a switching element configured to select pixels to perform light emission. The switching gate electrode 152 is connected to the gate line 151. The switching source electrode 173 is connected to the data line 171. The switching drain electrode 174 is spaced from (e.g., spaced apart from) the switching source electrode 173 and is connected to the first capacitor plate 158.

The driving TFT 20 applies a driving power to the pixel electrode 211 which causes a light emitting layer 212 of an organic light emitting element 210 in the selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the organic light emitting element 210 through a contact opening (e.g., a contact hole).

With the aforementioned structure, the switching TFT 10 is driven by a gate voltage applied to the gate line 151 and transmits a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the organic light emitting element 210 through the driving TFT 20 such that the organic light emitting element 210 may emit light.

A planarization layer 165 covers the data wiring (e.g., the data line 171, the common power line 172, the source electrodes 173 and 176, the drain electrodes 174 and 177, and the second capacitor plate 178) which are patterned by a single mask. The planarization layer 165 is disposed on the insulating interlayer 160.

The planarization layer 165 provides a planar surface to increase light emission efficiency of an organic light emitting element to be formed thereon. The planarization layer 165 may include a polyacrylate resin, an epoxy resin, a phenolic resin, a polyamide resin, a polyimide resin, an unsaturated polyester resin, a poly(p-phenylene)-based resin (e.g., phenyl ether or polyphenylene ether resin), a poly(p-phenylene) sulfide resin, and/or benzocyclobutene (BCB).

The pixel electrode 211 of the organic light emitting element 210 is disposed on the planarization layer 165. The pixel electrode 211 is connected to the drain electrode 177 through a contact opening (e.g., a contact hole) defined in the planarization layer 165.

A part of or the entirety of the pixel electrode 211 is disposed in a transmissive area (or a light emission area) of the pixel PX. For example, the pixel electrode 211 is disposed corresponding to (e.g., is disposed in) the transmissive area of the pixel defined by the pixel defining layer 190. The pixel defining layer 190 may include a resin, such as a polyacrylate resin and/or a polyimide resin.

The light emitting layer 212 is disposed on the pixel electrode 211 in the transmissive area, and the common electrode 213 is disposed on the pixel defining layer 190 and the light emitting layer 212.

The light emitting layer 212 includes a low molecular weight organic material or a high molecular weight organic material. At least one of a hole injection layer HIL and a hole transporting layer HTL may further be disposed between the pixel electrode 211 and the light emitting layer 212, and at least one of electron transporting layer ETL and an electron injection layer EIL may further be disposed between the light emitting layer 212 and the common electrode 213.

The pixel electrode 211 and the common electrode 213 may be formed as a transmissive electrode, a transflective electrode, or a reflective electrode.

A transparent conductive oxide ("TCO") may be used to form a transmissive electrode. The TCO may include indium tin oxide (ITO), indium zinc oxide (IZO), antimony tin oxide (ATO), aluminum zinc oxide (AZO), zinc oxide (ZnO), or a mixture thereof.

A metal, such as magnesium (Mg), silver (Ag), gold (Au), calcium (Ca), lithium (Li), chromium (Cr), aluminum (Al) and copper (Cu), or an alloy thereof, may be used to form a transflective electrode and a reflective electrode. In such an exemplary embodiment, whether an electrode is a transflective type or a reflective type depends on the thickness of the electrode. The transflective electrode may have a thickness of about 200 nm or less, and the reflective electrode may have a thickness of about 300 nm or more. As the thickness of the transflective electrode decreases, light transmittance and resistance increase. As the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The pixel PX may be a double-sided emission type configured to emit light in the direction of the pixel electrode 211 and the direction of the common electrode 213. In such an exemplary embodiment, both the pixel electrode 211 and the common electrode 213 may be formed as a transmissive electrode or a transflective electrode.

A sealing member 250 is disposed on the common electrode 213. The sealing member 250 may include a transparent insulating layer including glass or transparent plastic. Further, the sealing member 250 may have a thin film encapsulation structure including an inorganic layer and an organic layer. In such an exemplary embodiment, the inorganic layer and the organic layer may be alternately stacked. In other embodiments, a plurality of inorganic layers and a plurality of organic layers may be alternately stacked.

Figure 7:
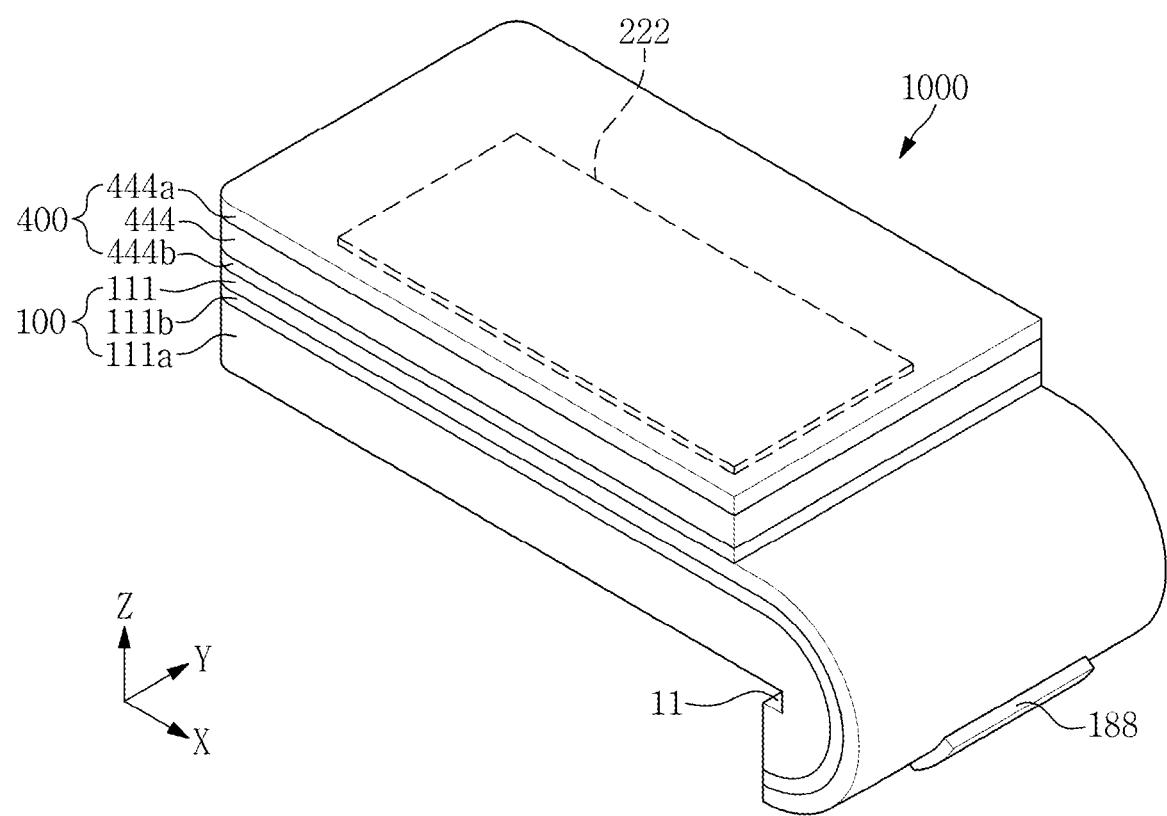
FIG. 7 is a view illustrating a state in which the display device shown in FIG. 1 is bent.

FIG. 7 is a view illustrating a state in which the display device shown in FIG. 1 is bent.

As illustrated in FIG. 7, the display device 1000 may be bent. For example, the display device 1000 may have a bent shape with respect to the groove 11 in an outermost protective layer (e.g., the display device 1000 may be bent about the groove 11).

Figure 8:
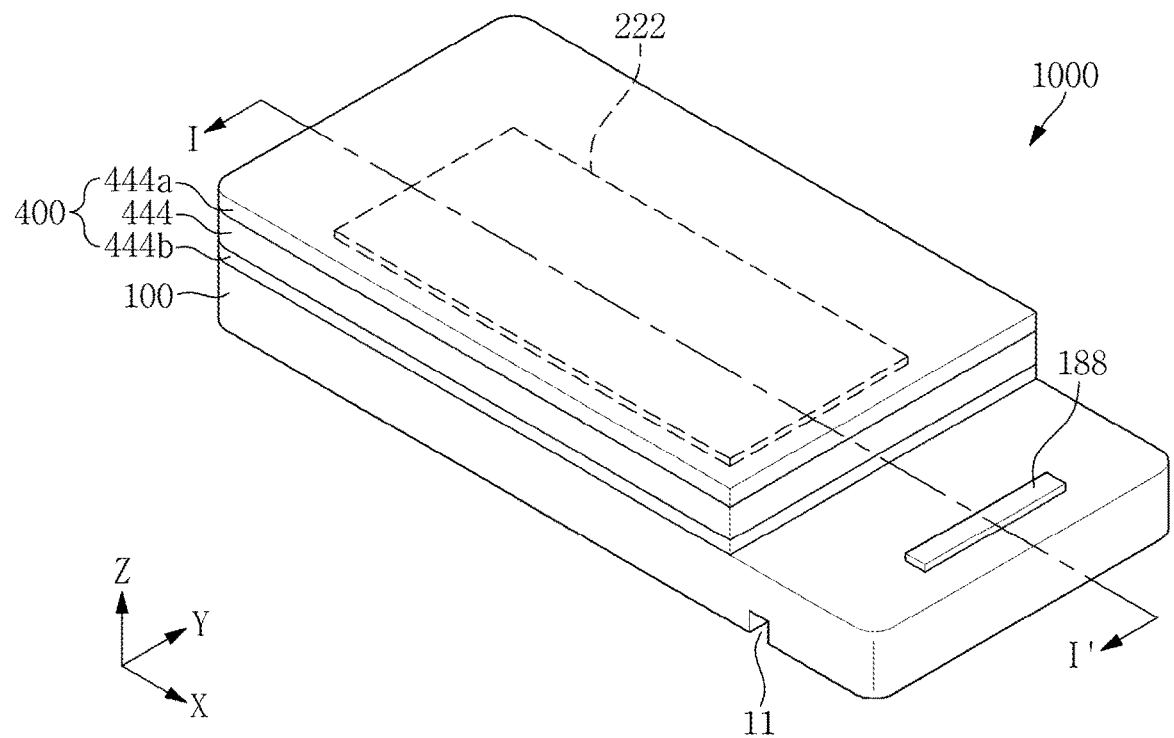
FIG. 8 is a perspective view illustrating a display device according to another exemplary embodiment.
Figure 9:
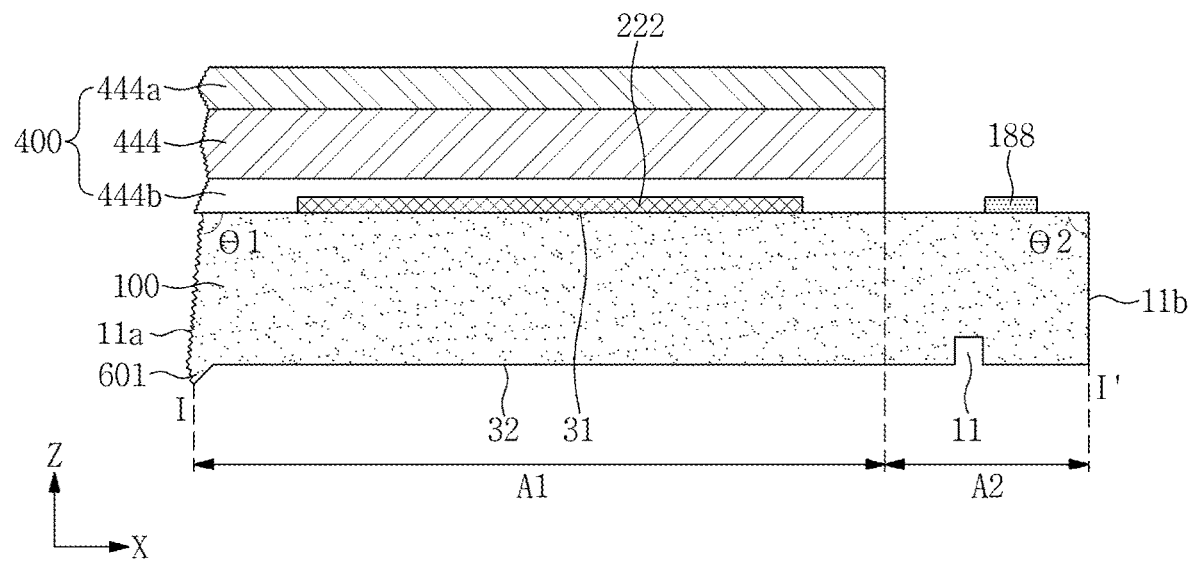
FIG. 9 is a cross-sectional view taken along the line I-I' of FIG. 8.

FIG. 8 is a perspective view illustrating a display device according to another exemplary embodiment, and FIG. 9 is a cross-sectional view taken along the line I-I' of FIG. 8.

As illustrated in FIGS. 8 and 9, a substrate 100 of a display device 1000 may include one layer (hereinafter, "a substrate") (e.g., the substrate 100 may be a single layer).

The substrate 100 includes a first end portion 11a located at a first area A1 of the substrate 100 and a second end portion 11b located at a second area A2 of the substrate 100.

The substrate 100 has facing surfaces, and one of the surfaces (hereinafter, "a lower surface 32") is located farther away from a polarizer 400 than another of the surfaces (hereinafter, "an upper surface 31") is therefrom. In such an exemplary embodiment, a protrusion 601 is located at a portion where the lower surface 32 of the substrate 100 meets the first end portion 11a of the substrate 100. For example, as illustrated in FIGS. 8 and 9, the substrate 100 includes the lower surface 32 and the upper surface 31 facing each other, and the protrusion 601 is located at a portion (hereinafter, "an edge portion") where the lower surface 32 of the substrate 100 meets the first end portion 11a. The protrusion 601 protrudes from the edge portion in the Z-axis direction. In such an exemplary embodiment, the protrusion 601 may further protrude from the edge portion in the X-axis direction and/or the Y-axis direction. As illustrated in FIGS. 8 and 9, no protrusion is located at the second end portion 11b of the substrate 100.

Because the first end portion 11a includes the protrusion 601, the first end portion 11a and the second end portion 11b have different lengths. The length of the first end portion 11a is a length in the Z-axis direction. Similarly, the length of the second end portion 11b is a length in the Z-axis direction. The first end portion 11a may be longer than (e.g., may have a longer length than) the second end portion 11b.

In addition, as described hereinabove, the substrate 100 includes the lower surface 32 and the upper surface 31, and an angle between the upper surface 31 and the first end portion 11a is different from an angle between the upper surface 31 and the second end portion 11b. For example, an angle θ1 between the upper surface 31 and the first end portion 11a is greater than an angle θ2 between the upper surface 31 and the second end portion 11b.

FIGS. 10-20 are explanatory views illustrating a method of manufacturing a display device according to an exemplary embodiment.

Figure 10:
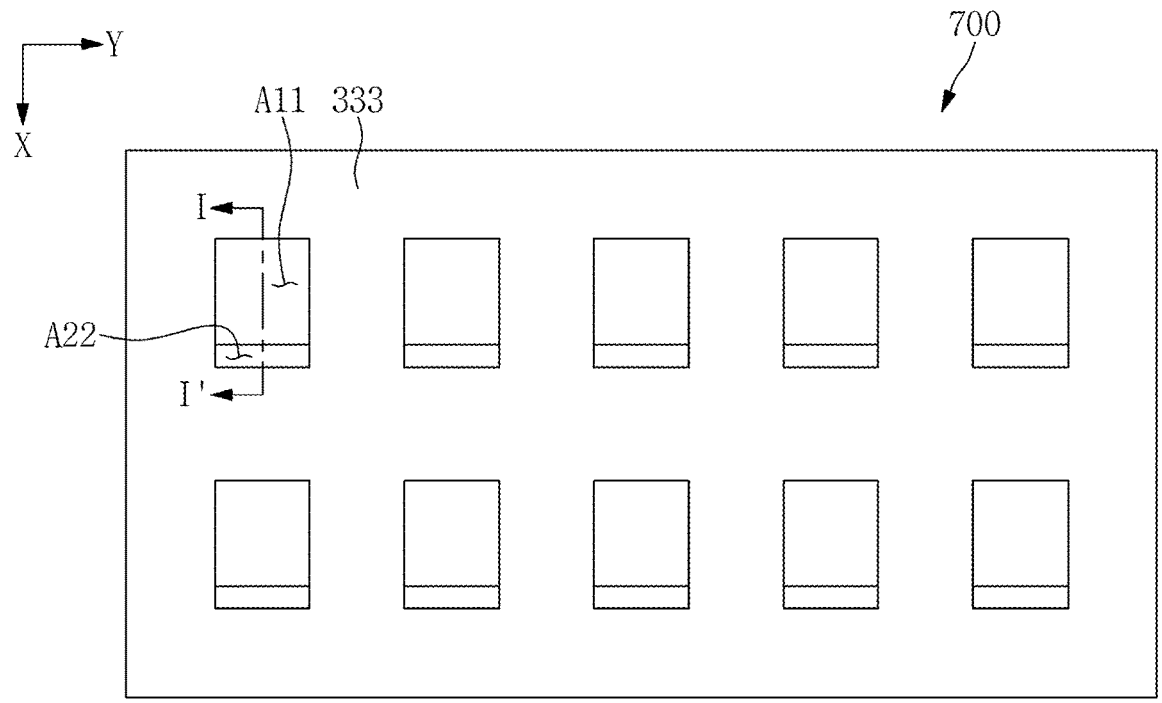
FIGS. 10-20 are explanatory views illustrating a method of manufacturing a display device according to an exemplary embodiment.
Figure 11:
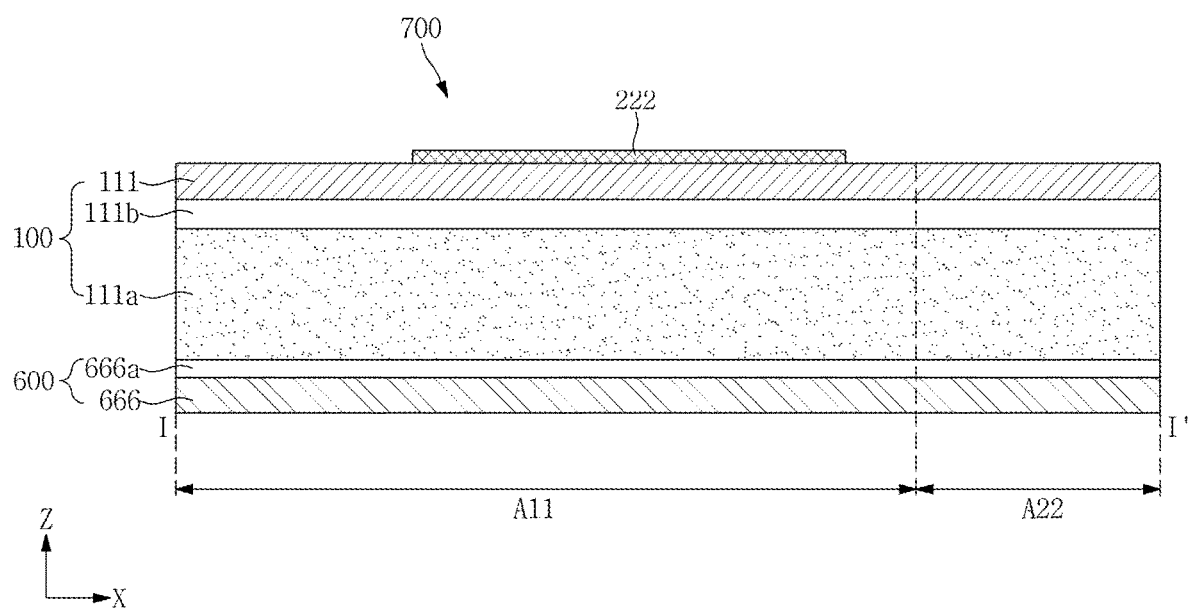

First, a mother panel 700 is prepared as shown in FIGS. 10 and 11. FIG. 11 is a cross-sectional view taken along the line I-I' of FIG. 10.

In FIG. 10, a plurality of first areas A11 and a plurality of second areas A22 are illustrated on the mother panel 700 to facilitate understanding, but the second areas A22 and the first areas A11 are not represented on the mother panel 700 in practice.

A pair of the first area A11 and the second area A22 of the mother panel 700 that are adjacent to each other correspond to the first area A1 and the second area A2 of the display device 1000 shown in FIG. 1 described above. The first area A11 of the mother panel 700 may be larger than the first area A1 of the display device 1000 described above, and the second area A22 of the mother panel 700 may be larger than the second area A2 of the display device 1000 described above.

As illustrated in FIG. 11, the mother panel 700 includes a carrier layer 600, a substrate 100, and a display layer 222.

The carrier layer 600 includes an adhesive layer 666a (hereinafter, "a third adhesive layer") and a protective layer 666 (hereinafter, "a third protective layer") below the substrate 100. The third adhesive layer 666a is located between the third protective layer 666 and a first protective layer 111a.

Figure 12:
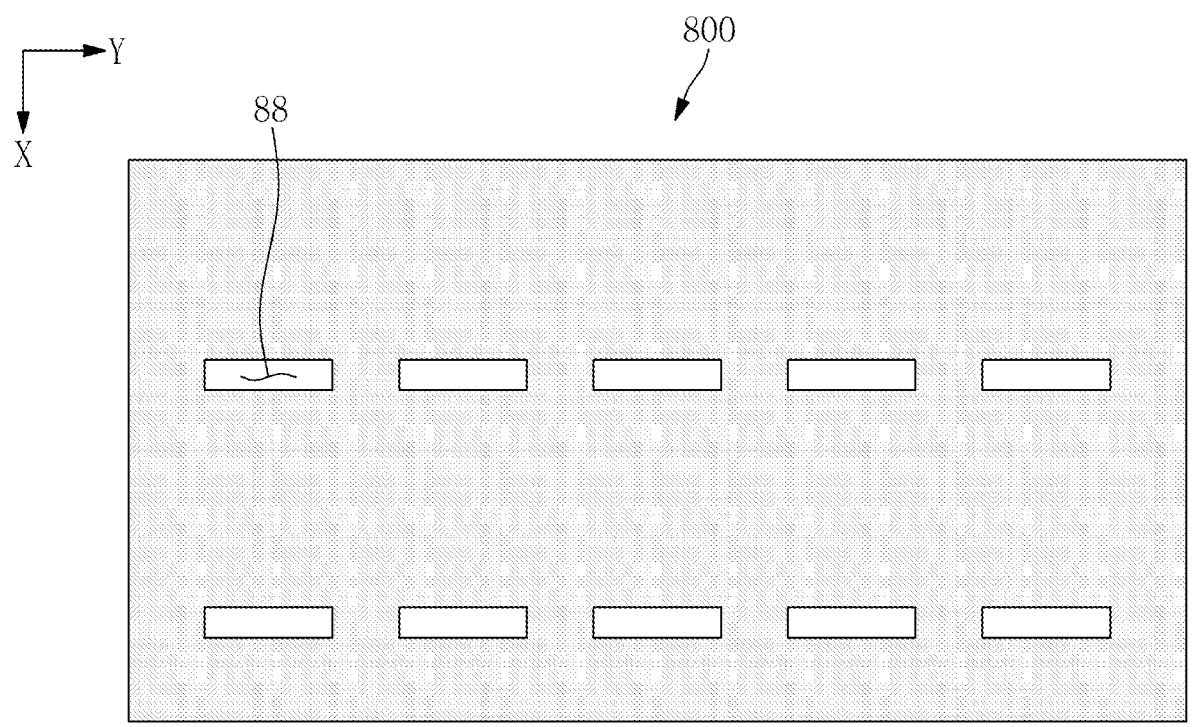
Figure 13:
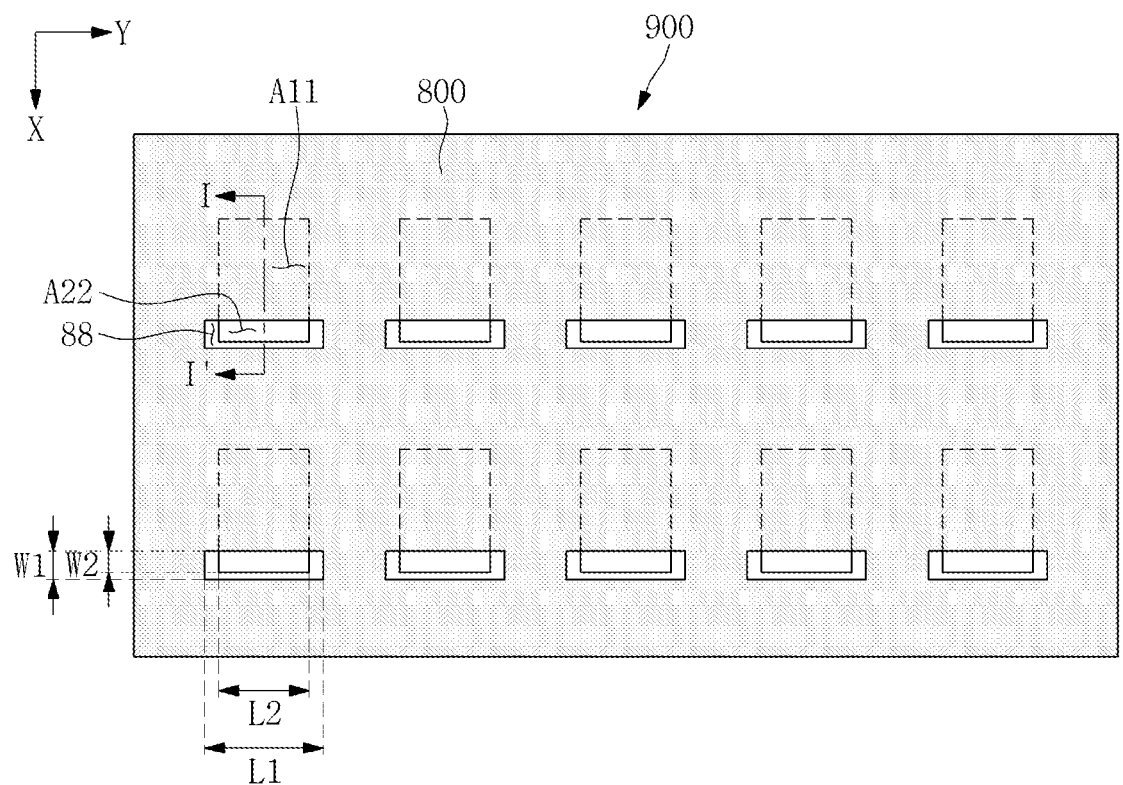

Subsequently, a mother polarizer 800 is prepared as shown in FIG. 12. The mother polarizer 800 has a plurality of openings 88 (e.g., a plurality of holes). The openings 88 may have a quadrangular shape. In such an exemplary embodiment, in order to substantially prevent an overlap of a polarizer 400 and the second area A2 due to an alignment error between the mother polarizer 800 and the mother panel 700, the openings 88 of the mother polarizer 80 may be larger than the second area A22 of the mother panel 700. For example, as illustrated in FIG. 13, a length L1 of the openings 88 may be greater than a length L2 of the second areas A22. As used herein, the length L1 of the openings 88 and the length L2 of the second areas A2 are lengths in the X-axis direction. In addition, a width W1 of the openings 88 may be greater than a width W2 of the second areas A2. As used herein, the width W1 of the openings 88 and the width W2 of the second areas A2 are lengths in the Y-axis direction.

Figure 14:
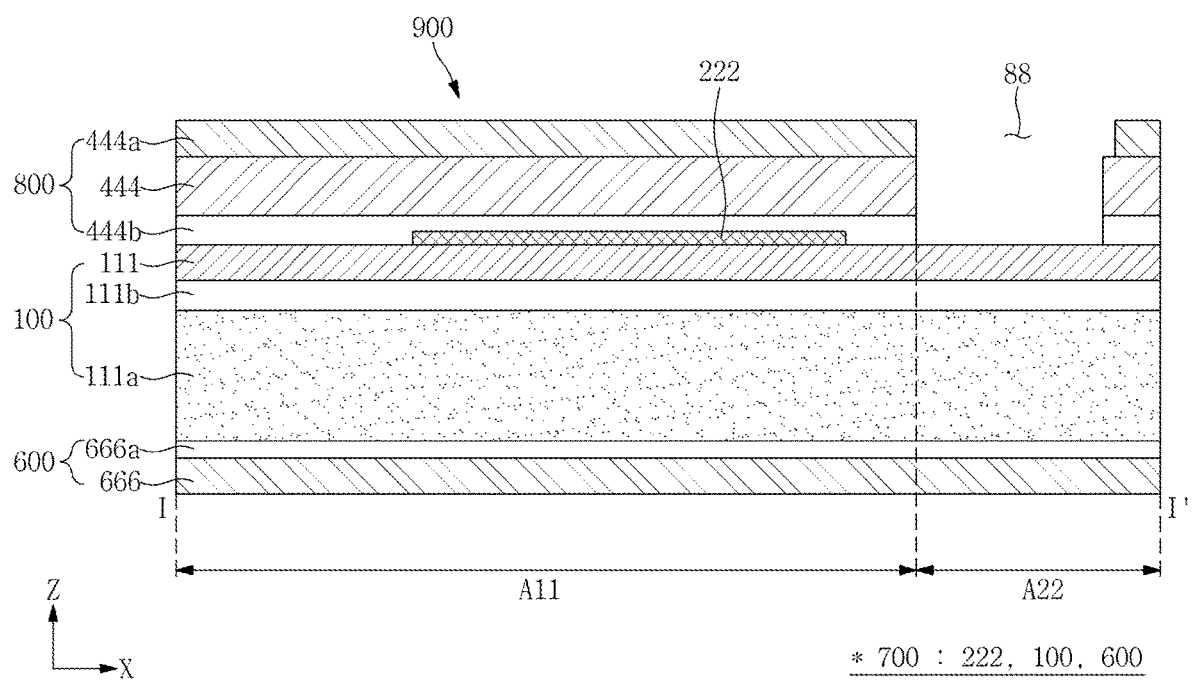

Subsequently, as illustrated in FIGS. 13 and 14, the mother polarizer 800 is attached to the mother panel 700. For example, as illustrated in FIG. 14, the mother polarizer 800 includes a second adhesive layer 444b, a polarizing layer 444, and a second protective layer 444a, and in such an exemplary embodiment, the mother polarizer 800 is attached to the mother panel 700 through the second adhesive layer 444b. As used herein, a structure in which the mother panel 700 and the mother polarizer 800 are attached to each other is defined as a mother attached panel 900.

Figure 15:
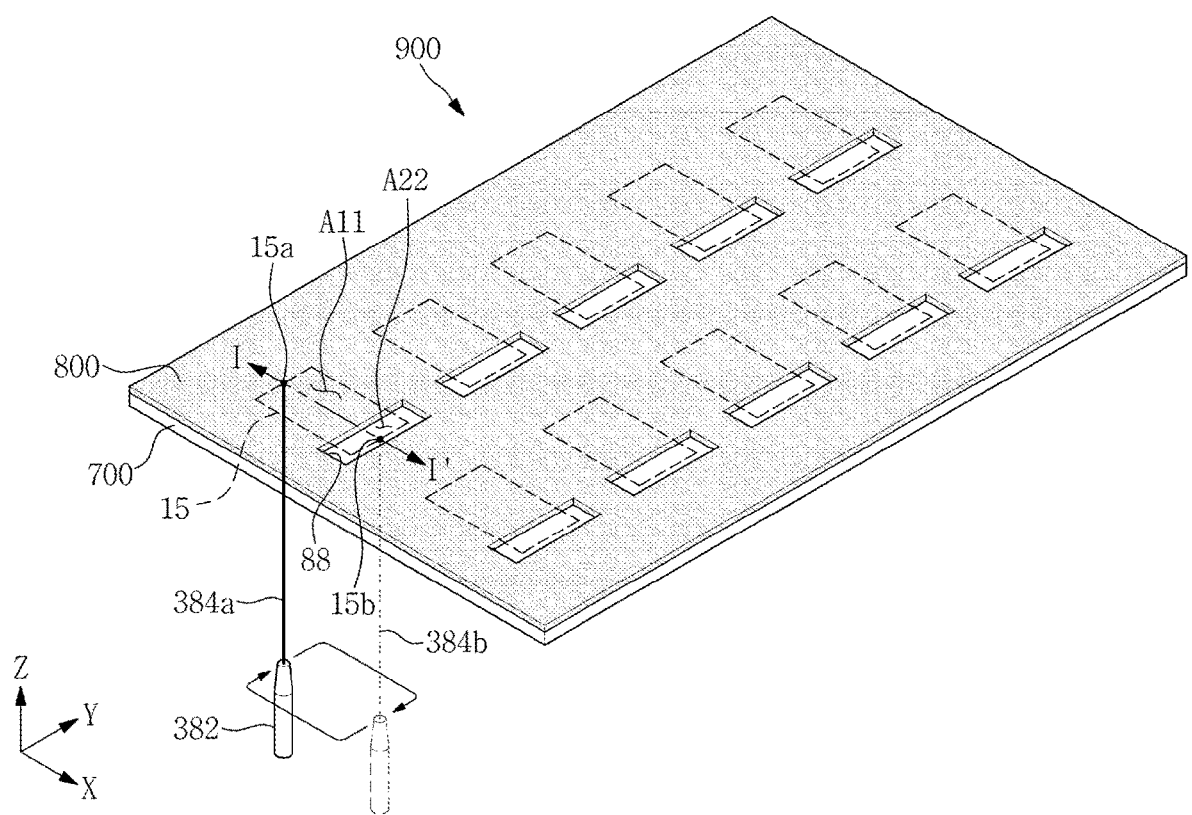

Subsequently, as illustrated in FIG. 15, a dividing process is performed whereby the mother attached panel 900 is divided into a plurality of unit panels. In some embodiments, the mother attached panel 900 is cut by laser beams 384a and 384b irradiated from a laser apparatus 382. An ultraviolet (UV) pico-second laser apparatus may be used as the laser apparatus 382.

As illustrated in FIG. 15, the laser beams 384a and 384b are irradiated in the Z-axis direction from below the mother attached panel 900 toward the mother attached panel 900. Accordingly, the laser beams 384a and 384b irradiated to the mother attached panel 900 pass through the mother panel 700 and then pass through the mother polarizer 800.

As illustrated in FIG. 15, the laser beams 384a and 384b irradiated to the mother attached panel 900 propagate (or move) along a cutting line 15 (hereinafter, "a first cutting line") having a closed loop shape surrounding (e.g., extending around a periphery of) the first area A1 and the second area A2 adjacent to each other, and accordingly, a portion surrounded by (e.g., within) the first cutting line 15 is separated from the mother attached panel 900. As used herein, the portion separated from the mother attached panel 900 is defined as a unit panel 950 (see, e.g., FIG. 16).

Through the dividing process, a plurality of unit panels 950 are obtained from one mother attached panel 900.

In an exemplary embodiment, because the openings 88 in the mother polarizer 800 are larger than the second areas A2 of the mother panels 700, portions of the mother attached panel 900 along the first cutting line 15 have different thicknesses. For example, as illustrated in FIG. 15, a portion 15a (hereinafter, "a first partial cutting line") of the first cutting line 15 that coincides with an outline of the first area A1 overlaps the mother panel 700 and the mother polarizer 800 of the mother attached panel 900, while a portion 15b (hereinafter, "a second partial cutting line") of the first cutting line 15 that coincides with an outline of the second area A2 overlaps the mother panel 700 of the mother attached panel 900, and accordingly, the mother attached panel 900 along the first partial cutting line 15a has a greater thickness than a thickness of the mother panel 700 along the second partial cutting line 15b.

The laser beam 384a (hereinafter, "a first laser beam") that is irradiated to (or along) the first partial cutting line 15a may have a higher intensity than the laser beam 384b (hereinafter, "a second laser beam") that is irradiated to (or along) the second partial cutting line 15b. For example, the first laser beam 384a having a relatively high intensity is irradiated along the first partial cutting line 15a of the mother attached panel 900, and the second laser beam 384b having a relatively low intensity is irradiated along the second partial cutting line 15b of the mother attached panel 900. For example, when the UV pico-second laser apparatus is used as the laser apparatus 382 as described above, the first laser beam 384a may be irradiated at a power of about 15 W to about 25 W and the second laser beam 384b may be irradiated at a power of about 3 W to about 10 W. In such an exemplary embodiment, each of the first laser beam 384a and the second laser beam 384b is irradiated in a pulse manner having a frequency of about 400 Hz and has a pulse width (e.g., a pulse duration) of about 15 ps. In an exemplary embodiment, each of the first laser beam 384a and the second laser beam 384b may have a spot size of about 22 μm.

Figure 16:
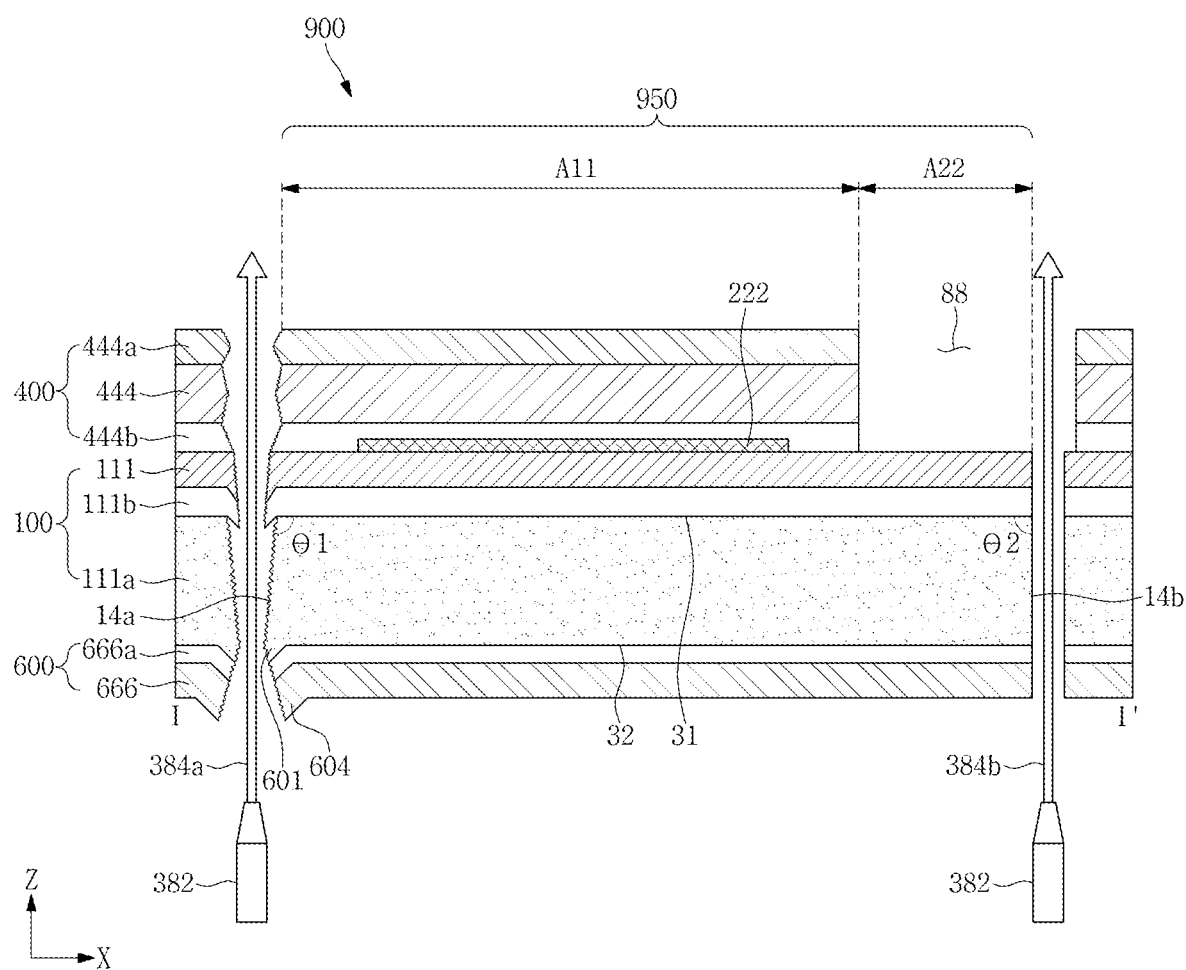

A length of an end portion of the unit panel 950 varies depending on the intensity of the laser beam. For example, an end portion of the unit panel 950 cut by the first laser beam 384a having a relatively high intensity has a longer length than a length of an end portion of the unit panel 950 cut by the second laser beam 384b having a relatively low intensity. As an example, as illustrated in FIGS. 2 and 16, the first protective layer 111a includes a first end portion 11a located at the first area A1 and a second end portion 11b located at the second area A2. In such an exemplary embodiment, the first end portion 11a of the first protective layer 111a has a longer length than a length of the second end portion 11b of the first protective layer 111a (e.g., the length of the first end portion 11a is longer than the length of the second end portion 11b).

As another example, the third protective layer 666 includes a first end portion 14a located at the first area A1, a second end portion 14b located at the second area A2, and a lower surface 62 and an upper surface 61 facing each other. In such an exemplary embodiment, a protrusion 604 is located at a portion (hereinafter, "an edge portion") where the lower surface 62 of the third protective layer 666 meets the first end portion 14a. The protrusion 604 protrudes from the edge portion in the Z-axis direction. In such an exemplary embodiment, the protrusion 604 may further protrude from the edge portion in the X-axis direction and/or in the Y-axis direction. As illustrated in FIG. 16, no protrusion is located at the second end portion 14b of the third protective layer 666. Due to the protrusion 604, the first end portion 14a of the third protective layer 666 has a longer length than the second end portion 14b of the third protective layer 666. Similarly, the third adhesive layer 666a includes a first end portion located at the first area A1, a second end portion located at the second area A2, and a lower surface and an upper surface facing each other. In such an exemplary embodiment, the first end portion and the second end portion of the third adhesive layer 666a may have substantially a same shape as a shape of the first end portion 14a and the second end portion 14b of the third protective layer 666 described above.

In addition, an inclination of the end portion of the unit panel 950 varies depending on the intensity of the laser beam. For example, an angle between the end portion of the unit panel 950 cut by the first laser beam 384a having relatively high intensity and a reference plane is greater than an angle between the end portion of the unit panel 950 cut by the second laser beam 384b having relatively low intensity and the reference plane. As a more detailed example, as illustrated in FIGS. 2 and 16, an angle $\theta 1$ between the upper surface 31 of the first protective layer 111a and the first end portion 11a is greater than an angle $\theta 2$ between the upper surface 31 of the first protective layer 111a and the second end portion 11b.

In an exemplary embodiment, an angle between the upper surface 61 of the third protective layer 666 and the first end portion 14a of the third protective layer 666 is less than an angle between the upper surface 61 of the third protective layer 666 and the second end portion 14b of the third protective layer 666. For example, an angle between the upper surface 61 of the third protective layer 666 and the first end portion 14a of the third protective layer 666 may be an acute angle, while an angle between the upper surface 61 of the third protective layer 666 and the second end portion 14b of the third protective layer 666 may be about 90 degrees. Similarly, an inclination of the first end portion and the second end portion of the third adhesive layer 666a may be substantially the same as the inclination of the first end portion 14a and the second end portion 14b of the third protective layer 666.

In addition, a surface roughness of the end portion of the unit panel 950 varies depending on the intensity of the laser beam. For example, the end portion of the unit panel 950 cut by the first laser beam 384a having relatively high intensity has a greater surface roughness than the end portion of the unit panel 950 cut by the second laser beam 384b having relatively low intensity. As a more detailed example, as illustrated in FIGS. 2 and 16, the first end portion 11a of the first protective layer 111a may have a greater surface roughness than the second end portion 11b. Similarly, a surface roughness of the first end portion and the second end portion of the third adhesive layer 666a may be substantially the same as the surface roughness of the first end portion 14a and the second end portion 14b of the third protective layer 666, respectively.

Figure 17:
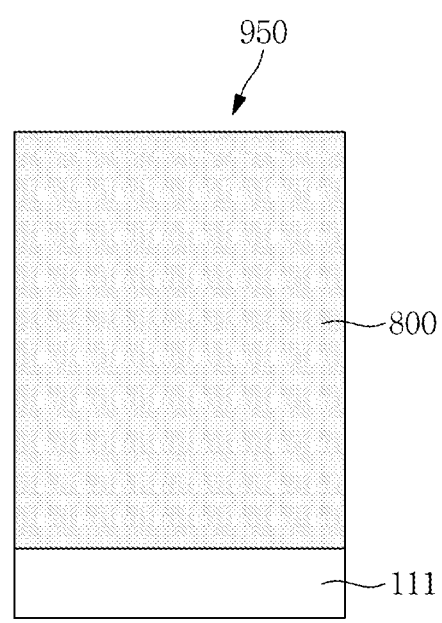

Through the dividing process as described above, a plurality of unit panels 950 are manufactured from one mother attached mother panel 900. FIG. 17 is a plan view illustrating one of the plurality of unit panels 950. Each of the unit panels 950 includes the substrate 100, the display layer 222, and the polarizer 400 as illustrated in, for example, FIG. 2.

Figure 18:
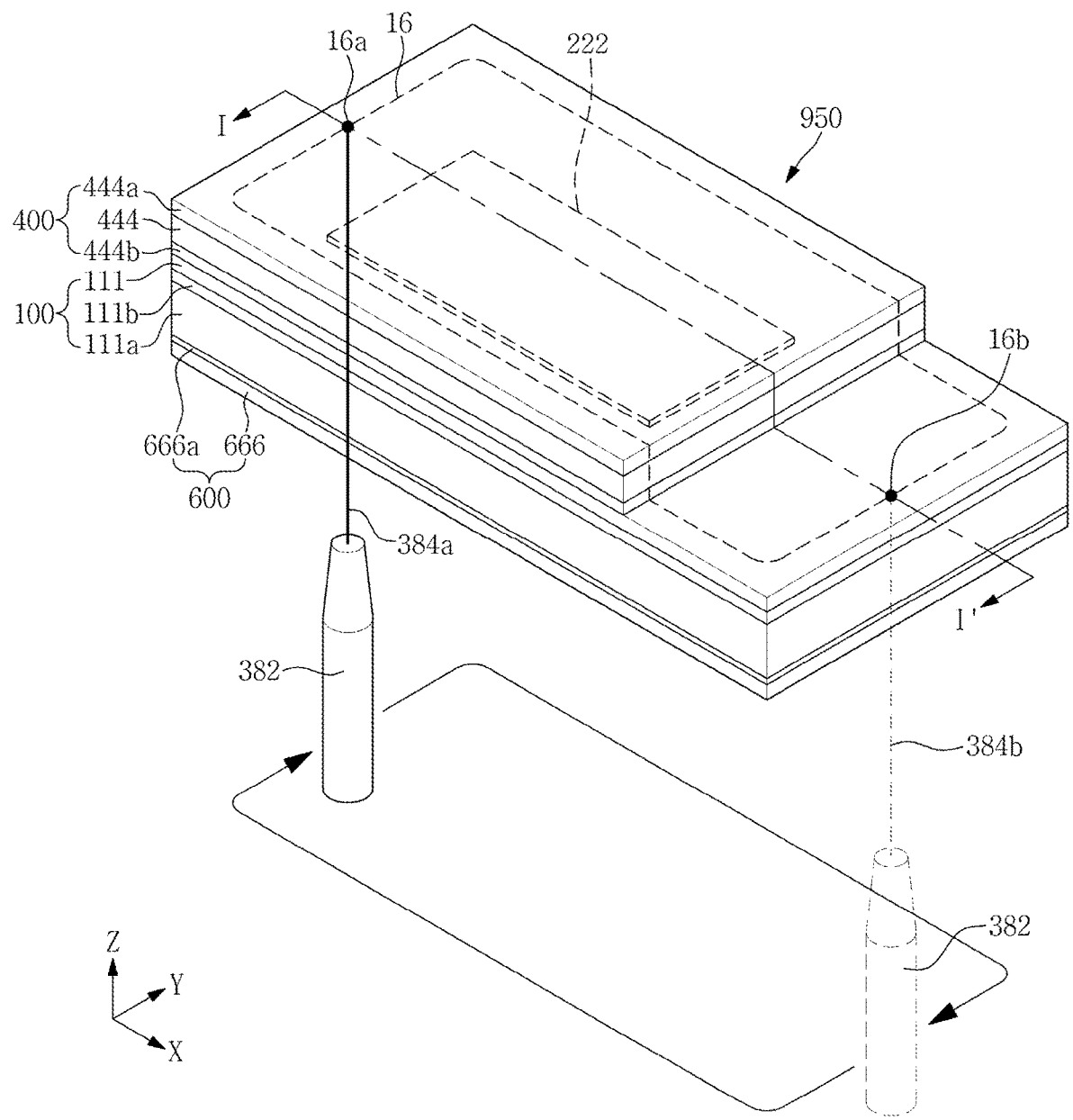

Subsequently, as illustrated in FIG. 18, a processing process is performed whereby the unit panel 950 is processed into a desired size and design. In the processing process, the unit panel 950 is cut by the laser beams 384a and 384b irradiated from the laser apparatus 382. As illustrated in FIG. 18, the laser beams 384a and 384b are irradiated from below the unit panel 950 toward the unit panel 950 in the Z-axis direction. Accordingly, the laser beams 384a and 384b irradiated to the unit panel 950 pass through the substrate 100 and then pass through the polarizer 400.

Figure 19:
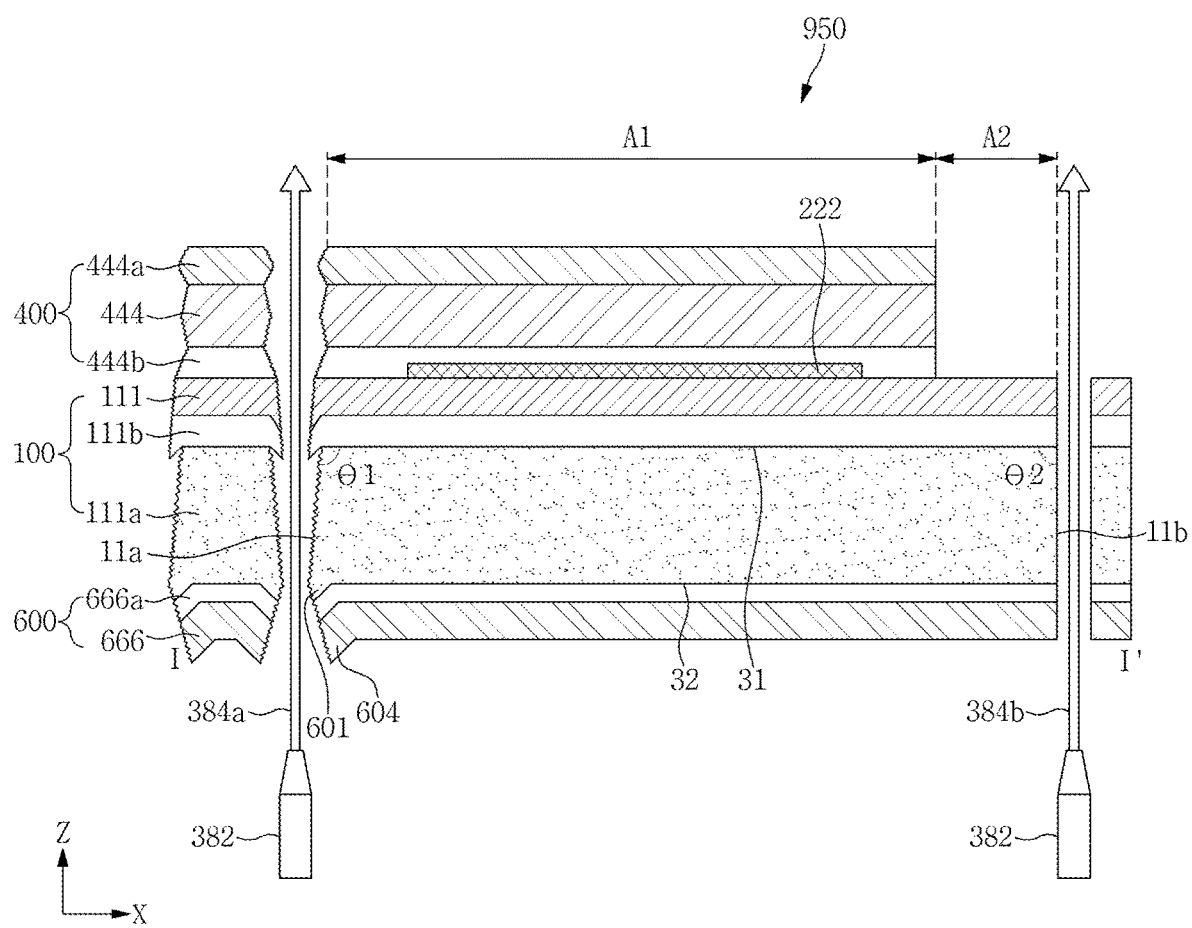

As illustrated in FIGS. 18 and 19, the laser beam irradiated to the unit panel 950 propagates along a cutting line 16 (hereinafter, "a second cutting line") having a closed loop shape surrounding (e.g., extending around a periphery of) the first area A1 and the second area A2 adjacent to each other, and accordingly, a portion of the unit panel 950 surrounded by (e.g., within) the second cutting line 16 and a portion of the unit panel 950 located outside the second cutting line 16 are separated from each other. As used herein, the portion of the unit panel 950 surrounded by (e.g., the portion of the unit panel 950 inside) the second cutting line 16 is defined as a unit processed panel 980.

The second cutting line 16 may have a rounded corner, and in such an exemplary embodiment, the unit processed panel 980 may have a rounded corner.

In an exemplary embodiment, because the polarizer 400 is not located in the second area A2 of the unit processed panel 980, the unit processed panel 980 cut out along the second cutting line 16 has different thicknesses. For example, a portion 16a (hereinafter, "a first partial cutting line") of the second cutting line 16 that coincides with an outline of the first area A1 overlaps the polarizer 400, while a portion 16b (hereinafter, "a second partial cutting line") of the second cutting line 16 that coincides with an outline of the second area A2 does not overlap the polarizer 400, and accordingly, the unit processed panel 980 cut along the first partial cutting line 16a has a greater thickness than a thickness of the unit processed panel 980 cut along the second partial cutting line 16b.

The first laser beam 384a irradiated to the first partial cutting line 16a may have a higher intensity than an intensity of the second laser beam 384b irradiated to the second partial cutting line 16b. For example, the first laser beam 384a having a relatively high intensity is irradiated along the first partial cutting line 16a of the unit processed panel 980, and the second laser beam 384b having a relatively low intensity is irradiated along the second partial cutting line 16b of the unit processed panel 980.

A length of an end portion of the unit processed panel 980 varies depending on the intensity of the laser beam. For example, an end portion of the unit processed panel 980 cut by the first laser beam 384a having relatively high intensity has a longer length than an end portion of the unit processed panel 980 cut by the second laser beam 384b having relatively low intensity. As a more detailed example, as illustrated in FIGS. 2 and 19, the first protective layer 111a includes a first end portion 11a located at the first area A1 and a second end portion 11b located at the second area A2. In such an exemplary embodiment, the first end portion 11a of the first protective layer 111a has a longer length than a length of the second end portion 11b of the first protective layer 111a. For example, the length of the first end portion 11a is longer than the length of the second end portion 11b.

In addition, an inclination of the end portion of the unit processed panel 980 varies depending on the intensity of the laser beam. For example, an angle between the end portion of the unit processed panel 980 cut by the first laser beam 384a having relatively high intensity and a reference plane is greater than an angle between the end portion of the unit processed panel 980 cut by the second laser beam 384b having relatively low intensity and the reference plane. As a more detailed example, as illustrated in FIGS. 2 and 19, an angle θ1 between the upper surface 31 of the first protective layer 111a and the first end portion 11a is greater than an angle θ2 between the upper surface 31 of the first protective layer 111a and the second end portion 11b.

In addition, a surface roughness of the end portion of the unit processed panel 980 varies depending on the intensity of the laser beam. For example, the end portion of the unit processed panel 980 cut by the first laser beam 384a having relatively high intensity has a greater surface roughness than that of the end portion of the unit processed panel 980 cut by the second laser beam 384b having relatively low intensity. As a more detailed example, as illustrated in FIGS. 2 and 19, the first end portion 11a of the first protective layer 111a may have a greater surface roughness than that of the second end portion 11b. Similarly, surface roughness of the first end portion and the second end portion of the third adhesive layer 666a may be substantially the same as the surface roughness of the first end portion 14a and the second end portion 14b of the third protective layer 666.

Figure 20:
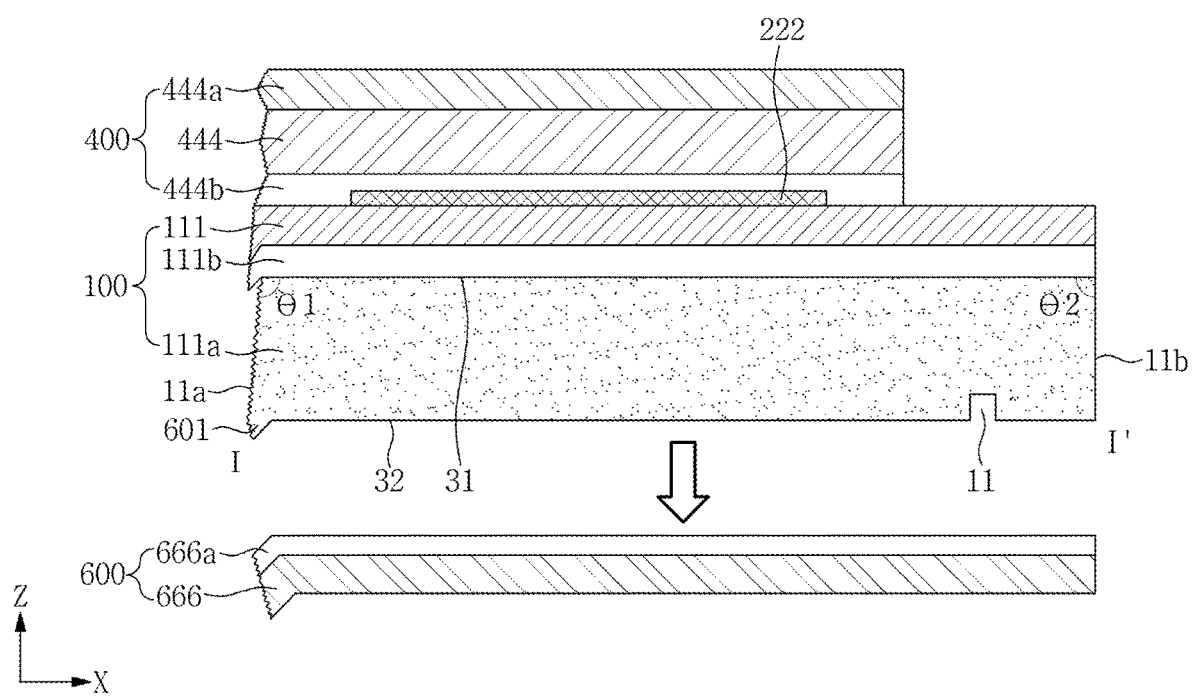

Subsequently, as illustrated in FIG. 20, the carrier layer 600 is separated from the unit processed panel 980. For example, the third protective layer 666 and the third adhesive layer 666a are removed from the unit processed panel 980.

Subsequently, a groove 11 is defined in the first protective layer 111a of the unit processed panel 980. For example, the groove 11 is defined in the lower surface 32 of the first protective layer 111a. This groove 11 may be defined by a laser beam.

Subsequently, the driving unit 188 is mounted on the unit processed panel 980 at the second area A2.

Through such a process, the unit processed panel 980 has the structure of the display device 1000 as illustrated in FIG. 1.

In an exemplary embodiment, unit polarizers may be used in place of the above-described mother polarizer 800. In such an exemplary embodiment, a cutting process is performed on the mother panel 700 absent the mother polarizer 800 shown in FIG. 15. For example, a dividing process is performed on the mother panel 700 illustrated in FIG. 10. The dividing process is substantially the same as the laser cutting process described with respect to FIG. 15 above. However, in such an exemplary embodiment, because the mother polarizer 800 is not attached to the mother panel 700, the mother panel 700 in the first area A1 has substantially the same thickness as a thickness of the mother panel 700 in the second area A2. Accordingly, a laser beam irradiated along the cutting line of the mother panel 700 may have a uniform or substantially uniform intensity. For example, a laser beam irradiated along a first partial cutting line corresponding to the first area A1 of the mother panel 700 may have substantially the same intensity as an intensity of a laser beam irradiated along a second partial cutting line corresponding to the second area A2 of the mother panel 700. Subsequently, when a plurality of unit panels 950 are separated from the mother panel 700, the unit polarizers are individually attached to the unit panels 950. The unit polarizer is attached to the first area A1 of the unit panel 950. For example, the unit polarizer is not attached to the second area A2 of the unit panel 950. The unit polarizer, as the mother polarizer 800 described above, includes a second adhesive layer 444b, a polarizing layer 444, and a second protective layer 444a. The unit panel 950, to which such a unit polarizer is attached, is substantially the same as the unit panel 950 shown in FIG. 17 described above. The unit panel 950, to which such a unit polarizer is attached, is processed into a desired shape through the processes illustrated with respect to FIGS. 18 and 19 described above. Subsequently, as illustrated in FIG. 20, the carrier layer 600 is removed from the processed unit panel 950. Then, the groove 11 and the driving unit 188 described above are formed in or provided to the unit processed panel 980 from which the carrier layer 600 is removed.

In an exemplary embodiment, a touch screen panel may be used as the functional member in place of the polarizer 400 described above. In addition, both of the polarizer 400 and the touch screen panel may be used as the functional member. In such an exemplary embodiment, the touch screen panel is located on the polarizer.

The manufacturing method according to an exemplary embodiment may be applied to a liquid crystal display ("LCD") device or an electrophoretic display device. For example, an LCD device or an electrophoretic display device selectively including the polarizer or the touch screen panel in the non-pad area (i.e., the first area) as described above may be processed by laser beams having different intensities.

As set forth hereinabove, according to exemplary embodiments, a display device and a method of manufacturing the display device is provided that results in a display device having different thicknesses between the pad area and the non-pad area due to the functional member being attached to the non-pad area. For example, the pad area has a greater thickness than that of the non-pad area.

According to one or more exemplary embodiments, in a laser process applied to the display device or a cutting process applied to the mother panel, a relatively high intensity laser beam is irradiated to the substrate corresponding to the non-pad area and a relatively low intensity laser beam is irradiated to the substrate corresponding to the pad area. Accordingly, the substrate may be easily cut in the non-pad area and carbonization of and damage to the substrate in the pad area may be reduced or substantially minimized.

For example, because the non-pad area is relatively thick, it has a high resistance against a laser beam. Accordingly, although a laser beam having a relatively high intensity is irradiated to the non-pad area, carbonization and damage of the substrate and the functional member at the non-pad area may be reduced or substantially minimized. Further, the substrate and the functional member in the non-pad area may be easily cut by the laser beam having relatively high intensity. On the other hand, because the pad area is relatively thin, it has a low resistance to a laser beam and may be easily cut by a laser beam having relatively low intensity due to its thickness. In such a case, carbonization and damage of the substrate in the pad area may be reduced or minimized due to the low intensity laser beam.

While the present invention has been illustrated and described with reference to the exemplary embodiments thereof, it will be apparent to those of ordinary skill in the art that various changes in form and detail may be made thereto without departing from the spirit and scope of the present invention as defined by the following claims and their equivalents.

What is claimed is:

1. A method of manufacturing a display device, the method comprising:
    preparing a substrate comprising a first area and a second area disposed in a first direction and comprising at least one layer disposed along a second direction intersecting the first direction;
    forming a display layer at the first area of the substrate;
    forming a functional member at the first area to overlap the display layer; and
    cutting the substrate and the functional member by irradiating a laser beam along a cutting line surrounding the first area and the second area,
    wherein the laser beam applied to a portion of the cutting line corresponding to an outline of the first area has a higher intensity than an intensity of a laser beam applied to a portion of the cutting line corresponding to an outline of the second area.

2. The method as claimed in claim 1, wherein the laser beam applied to the portion of the cutting line corresponding to the outline of the first area is irradiated to the substrate at a power of about 15 W to about 25 W, and
    the laser beam applied to the portion of the cutting line corresponding to the outline of the second area is irradiated to the substrate at a power of about 3 W to about 10 W.

3. The method as claimed in claim 1, wherein the laser beam is irradiated to the substrate in a pulse manner having a frequency of about 400 Hz.

4. The method as claimed in claim 1, wherein the laser beam has a spot size of about 22 μm.

* * * * *